(12) United States Patent
Yeh et al.

(10) Patent No.: US 12,463,102 B2
(45) Date of Patent: Nov. 4, 2025

(54) SEMICONDUCTOR DEVICE STRUCTURE AND METHOD FOR FORMING THE SAME

(71) Applicant: XINTEC INC., Taoyuan (TW)

(72) Inventors: Hsiao-Lan Yeh, Tainan (TW);
Chin-Kang Chen, Taoyuan (TW);
Kung-Hua Cheng, Taoyuan (TW);
Szu-Hui Ma Lee, Taoyuan (TW);
Chi-Jia Tong, Taoyuan (TW)

(73) Assignee: XINTEC INC., Taoyuan (TW)

( * ) Notice: Subject to any disclaimer, the term of this patent is extended or adjusted under 35 U.S.C. 154(b) by 332 days.

(21) Appl. No.: 18/310,488

(22) Filed: May 1, 2023

(65) Prior Publication Data
US 2023/0369151 A1 Nov. 16, 2023

Related U.S. Application Data

(60) Provisional application No. 63/340,896, filed on May 11, 2022.

(51) Int. Cl.
| | | |
|---|---|---|
| *H01L 23/14* | (2006.01) | |
| *H01L 21/02* | (2006.01) | |
| *H01L 21/56* | (2006.01) | |
| *H01L 21/683* | (2006.01) | |

(52) U.S. Cl.
CPC ...... *H01L 23/142* (2013.01); *H01L 21/02348* (2013.01); *H01L 21/56* (2013.01); *H01L 21/6835* (2013.01); *H01L 2221/68318* (2013.01); *H01L 2221/68345* (2013.01)

(58) Field of Classification Search
CPC . H01L 23/142; H01L 23/14; H01L 21/02348; H01L 21/56; H01L 21/6835; H01L 21/02002; H01L 21/76251; H01L 2221/68318; H01L 2221/68345; H10F 39/809
See application file for complete search history.

(56) References Cited

U.S. PATENT DOCUMENTS

| | | | | |
|---|---|---|---|---|
| 7,341,924 B2 * | 3/2008 | Takayama | .......... | H10D 86/0214 438/455 |
| 2009/0079336 A1 * | 3/2009 | Yamada | ............... | H10K 59/876 313/504 |
| 2009/0142888 A1 * | 6/2009 | Tsuchiya | .............. | H10D 84/038 438/763 |

(Continued)

*Primary Examiner* — Dao H Nguyen
(74) *Attorney, Agent, or Firm* — LIU & LIU

(57) ABSTRACT

A semiconductor device structure is provided. The semiconductor device structure includes a first transparent substrate, a conductive layer, an insulating protective layer, a second transparent substrate, a device substrate, and a bonding layer. The first transparent substrate has a first surface and an opposite second surface. The conductive layer is disposed on the second surface of the first transparent substrate. The insulating protective layer covers the conductive layer and the first transparent substrate. The second transparent substrate is disposed above the first transparent substrate, and has a first surface facing the first transparent substrate and an opposite second surface. The device substrate is disposed on the second surface of the second transparent substrate. The bonding layer is bonded to the insulating protective layer and the first surface of the second transparent substrate.

20 Claims, 6 Drawing Sheets

(56) References Cited

U.S. PATENT DOCUMENTS

| | | | |
|---|---|---|---|
| 2011/0081747 A1* | 4/2011 | Yoshitomi | H10D 86/60 257/E21.328 |
| 2014/0285732 A1* | 9/2014 | Tanabe | G02F 1/134309 349/12 |
| 2018/0067592 A1* | 3/2018 | Kimura | G06F 3/047 |
| 2025/0107389 A1* | 3/2025 | Yamazaki | H10D 84/01 |

* cited by examiner

SEMICONDUCTOR DEVICE STRUCTURE AND METHOD FOR FORMING THE SAME

CROSS REFERENCE TO RELATED APPLICATIONS

This application claims the benefit of U.S. Provisional Application No. 63/340,896, filed May 11, 2022, the entirety of which is incorporated by reference herein.

BACKGROUND OF THE INVENTION

Field of the Invention

The invention relates to semiconductor technology, and in particular to a semiconductor device structure and a method for forming the same.

Description of the Related Art

Semiconductor devices are widely used in personal computers, mobile phones, digital cameras, and other electronic products. Semiconductor devices are usually formed by depositing various film layers, such as insulating layers (or dielectric layers), conductive layers (or metal layers) and semiconductor material layers on a semiconductor substrate, and patterning the various material layers using lithography and etching techniques to form circuit components or devices disposed on or within the semiconductor substrate and the interconnect structures connecting these circuit components and devices.

As the manufacturing process of semiconductor devices becomes more complex, several problems arise that should be addressed. For example, during the fabrication of a semiconductor device structure, the semiconductor substrate needs to be fixed for the semiconductor processes to be performed. Semiconductor tools typically use an electrostatic chuck to hold the semiconductor substrate in place so that the semiconductor fabrication processes can be performed.

However, the chucking force of an electrostatic chuck tends to decrease during the semiconductor processes, and as a result, these semiconductor processes cannot be carried out smoothly. Accordingly, there is a need for a novel semiconductor device structure and methods for forming the same capable of eliminating or mitigating the aforementioned problems.

BRIEF SUMMARY OF THE INVENTION

An embodiment of the present disclosure provides a semiconductor device structure. The semiconductor device structure includes a first transparent substrate, a conductive layer, an insulating protective layer, a second transparent substrate, a device substrate, and a bonding layer. The first transparent substrate has a first surface and a second surface. The second surface is opposite the first surface. The conductive layer is disposed on the second surface of the first transparent substrate. The insulating protective layer covers the conductive layer and the first transparent substrate. The second transparent substrate is disposed over the first transparent substrate. The second transparent substrate has a first surface facing the first transparent substrate. The second transparent substrate has a second surface opposite the first surface. The device substrate is disposed on the second surface of the second transparent substrate. The bonding layer bonds the insulating protective layer to the first surface of the second transparent substrate.

An embodiment of the present disclosure provides a method for forming a semiconductor device structure. The method includes providing a first transparent substrate having a first surface and a second surface, which are opposite one another. The method includes forming a conductive layer on the second surface of the first transparent substrate. The method includes forming an insulating protective layer to cover the conductive layer and the first transparent substrate. The method includes providing a second transparent substrate and a device substrate. The second transparent substrate has a first surface and a second surface, which are opposite one another. The device substrate is disposed on the second surface of the second transparent substrate. The method includes bonding the insulating protective layer to the first surface of the second transparent substrate via a bonding layer.

An embodiment of the present disclosure provides a semiconductor device structure. The semiconductor device structure includes a temporary carrier substrate, a conductive layer, and an insulating protective layer. The conductive layer is disposed on the temporary carrier substrate. The insulating protective layer covers the conductive layer and the temporary carrier substrate.

BRIEF DESCRIPTION OF THE DRAWINGS

The present disclosure can be more fully understood by reading the subsequent detailed description and examples with references made to the accompanying drawings, wherein.

DETAILED DESCRIPTION OF THE INVENTION

The making and using of the embodiments of the present disclosure are discussed in detail below. However, it should be noted that the embodiments provide many applicable inventive concepts that can be embodied in a variety of specific methods. The specific embodiments discussed are merely illustrative of specific methods to make and use the embodiments, and do not limit the scope of the disclosure. In addition, the present disclosure may repeat reference numbers and/or letters in the various embodiments. This repetition is for the purpose of simplicity and clarity, and does not imply any relationship between the different embodiments and/or configurations discussed. Moreover, when a first material layer is referred to as being on or overlying a second material layer, the first material layer may be in direct contact with the second material layer, or separated from the second material layer by one or more material layers.

A semiconductor device structure according to the embodiments of the present disclosure may be implemented to various electronic components of integrated circuits including active or passive devices or digital or analog circuits. For example, the semiconductor device structure is related to optoelectronic devices, micro-electro-mechanical systems (MEMS), biometric devices, micro fluidic systems, and physical sensors measuring changes to physical quantities such as heat, light, capacitance, pressure, and so on. In particular, a wafer-level package (WSP) process may optionally be used to package semiconductor chips, such as image-sensor elements, light-emitting diodes (LEDs), solar cells, RF circuits, accelerators, gyroscopes, fingerprint recognition devices, micro actuators, surface acoustic wave devices, pressure sensors, ink printer heads, and so on.

The above-mentioned wafer-level package process mainly means that after the packaging step is accomplished during the wafer stage, the wafer with chips is cut to obtain individual packages. However, in a specific embodiment, separated semiconductor chips may be redistributed on a carrier wafer and then packaged, which may also be referred to as a wafer-level package process. In addition, the above-mentioned wafer-level package process may also be adapted to form a chip package having multi-layer integrated circuit devices by a stack of a plurality of wafers having integrated circuits.

Figure 1A:
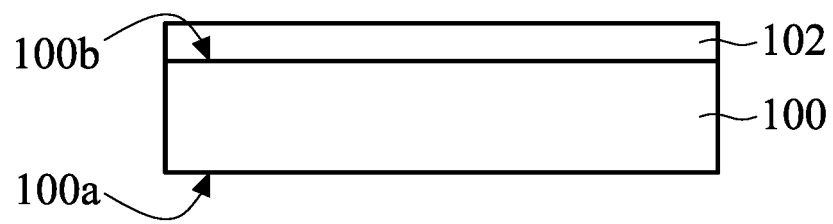
FIGS. 1A to 1D are cross-sectional views of semiconductor device structures at various stages of fabrication in accordance with some embodiments.

FIGS. 1A to 1D are cross-sectional views of semiconductor device structures at various stages of fabrication in accordance with some embodiments. Referring to FIG. 1A, a first transparent substrate 100 is provided, which has a first surface 100a and a second surface 100b, which are opposite one another. For example, the first surface 100a may be the lower surface of the first transparent substrate 100, and the second surface 100b may be the upper surface of the first transparent substrate 100. In some of embodiments, the first transparent substrate 100 includes glass, quartz, transparent polymer material or another suitable transparent material. In some other embodiments, the first transparent substrate 100 is a glass wafer, which facilitates the wafer-level packaging (WLP) process and serves as a temporary carrier substrate in the manufacture of the semiconductor device structure.

Afterwards, a bonding layer 102 is formed on the second surface 100b of the first transparent substrate 100. In order to facilitate the WLP process, the bonding layer 102 may be used as an adhesive layer between the first transparent substrate 100 and other structures, so as to temporarily bond the first transparent substrate 100 with other structures. In some embodiments, the bonding layer 102 includes temporary bonding materials, such as a light-to-heat conversion (LTHC) material, an ultraviolet (UV) curing material, or a thermal curing material.

Figure 1B:
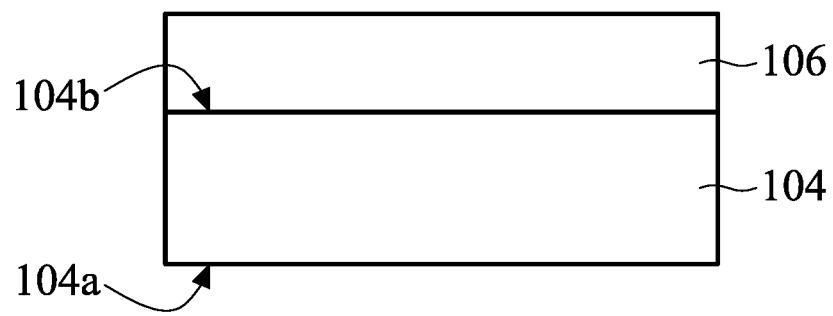

Next, referring to FIG. 1B, a second transparent substrate 104 and a device substrate 106 are provided. In some embodiments, the second transparent substrate 104 has a first surface 104a and a second surface 104b, which are opposite one another. For example, the first surface 104a may be the lower surface of the second transparent substrate 104, and the second surface 104b may be the upper surface of the second transparent substrate 104. Alternatively, the first surface 104a may be the upper surface of the second transparent substrate 104, and the second surface 104b may be the lower surface of the second transparent substrate 104. In some embodiments, the second transparent substrate 104 may include glass, quartz, transparent polymer material or another suitable transparent material. In some other embodiments, the second transparent substrate 104 is a glass wafer, which facilitates the WLP process, and serves as a carrier substrate or a cover plate for the device substrate 106 in the manufacture of the semiconductor device structure. In some embodiments, the thickness of the second transparent substrate 104 is greater than the thickness of the first transparent substrate 100. For example, the thickness of the first transparent substrate 100 is about 300 micrometers (μm), and the thickness of the second transparent substrate 104 is about 400 μm.

In some embodiments, the device substrate 106 is disposed on the second surface 104b of the second transparent substrate 104. For example, the device substrate 106 is a semiconductor wafer (e.g., a silicon wafer), which includes chip regions, and each chip region can be an image sensor chip region, such as a CMOS image sensor (CIS) chip region. Herein, in order to simplify the diagram, only a flat substrate is shown. Various semiconductor processes (e.g., deposition, lithography, and/or etching processes) can be performed for each chip region, so as to form a sensing device. For example, the sensing region includes an image sensing device. Also, the sensing device may include a device for sensing biometric characteristics (e.g., a fingerprint recognition device), a device for sensing environmental characteristics (e.g., a temperature sensing device, a humidity sensing device, a pressure sensing device, or a capacitive sensing device) or another suitable sensing device.

In some embodiments, an insulating layer (not shown) is formed on the device substrate 106. The insulating layer may include an interlayer dielectric (ILD) layer, an inter-metal dielectric (IMD) layer, a passivation layer, or combinations thereof. One or more conductive pads can be formed in the insulating layer. The insulating layer may be a single-layer conductive layer or a multi-layer conductive layer structure. The formed sensing device can be electrically connected to the conductive pads via the interconnect structures formed in the device substrate 106 and the insulating layer. The insulating layer, the conductive pads and the interconnect structures can be formed by various semiconductor processes (e.g., deposition, lithography and/or etching processes).

Figure 1C:
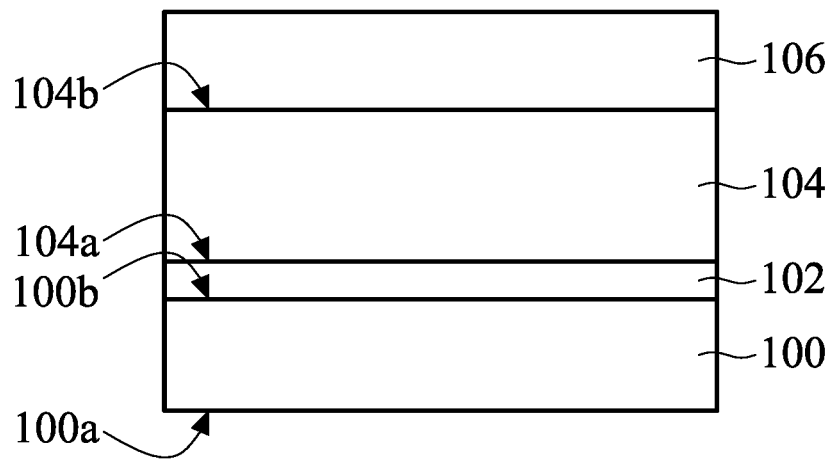

Next, referring to FIG. 1C, the second surface 100b of the first transparent substrate 100 is bonded to the first surface 104a of the second transparent substrate via the bonding layer 102.

Figure 1D:
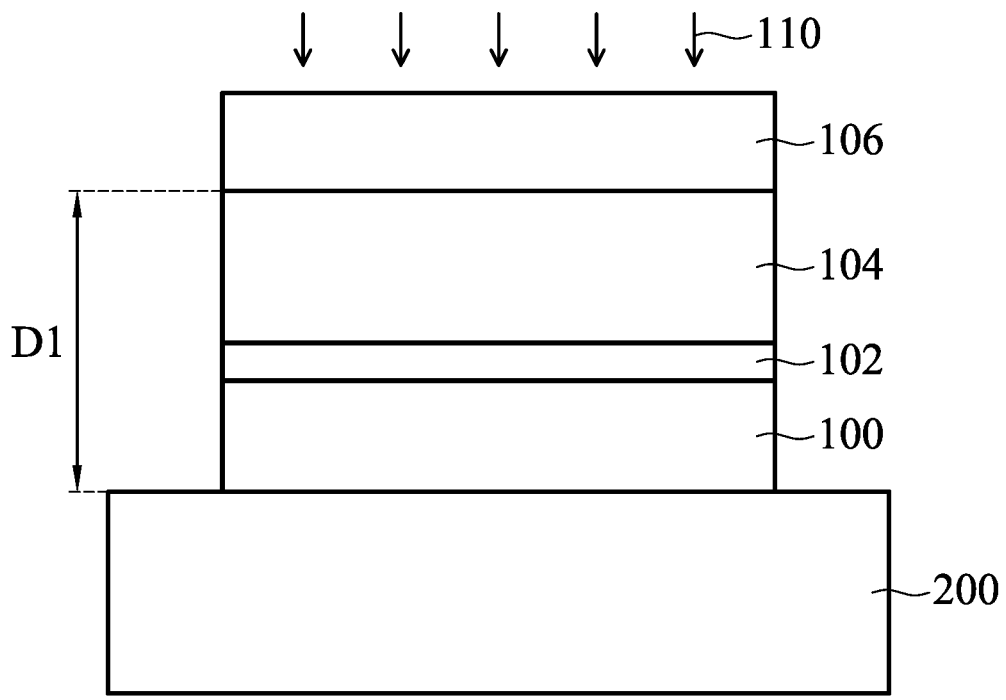

Next, referring to FIG. 1D, after bonding the first transparent substrate 100 to the second transparent substrate 104, the structure shown in FIG. 1C (i.e., the first transparent substrate 100 on which the device substrate 106 and the second transparent substrate 104 are formed) is placed on an electrostatic chuck 200 in a process chamber (not shown), so as to facilitate a subsequent semiconductor process 110. Before the semiconductor process 110 is performed, voltage can be applied to the electrostatic chuck 200 to generate a chucking force between the device substrate 106 and the electrostatic chuck 200, thereby affixing the structure shown in FIG. 1C to the electrostatic chuck 200, in which the first surface 100a of the first transparent substrate 100 faces the upper surface of the electrostatic chuck 200, as shown in FIG. 1D.

Afterwards, the semiconductor process 110 is performed on the device substrate 106 on the electrostatic chuck 200. For example, the process chamber is an etching process chamber, and the semiconductor process is an etching process for forming the insulating layer, conductive pads and/or interconnection structures. The semiconductor device structure on the electrostatic chuck 200 is prone to outgassing during the semiconductor processes, resulting in a reduction in the chucking force. As a result, it is not conducive to the progress of the semiconductor processes because the semiconductor device structure cannot be affixed to the electrostatic chuck 200. In order to address the above problems, before applying voltage to the electrostatic chuck 200, pre-baking (e.g., oven baking) and vacuum pumping are successively performed on the semiconductor device structure to eliminate or mitigate outgassing. In addition, in order to enhance the chucking force, the voltage applied to the electrostatic chuck 200 can be increased.

Figure 2:
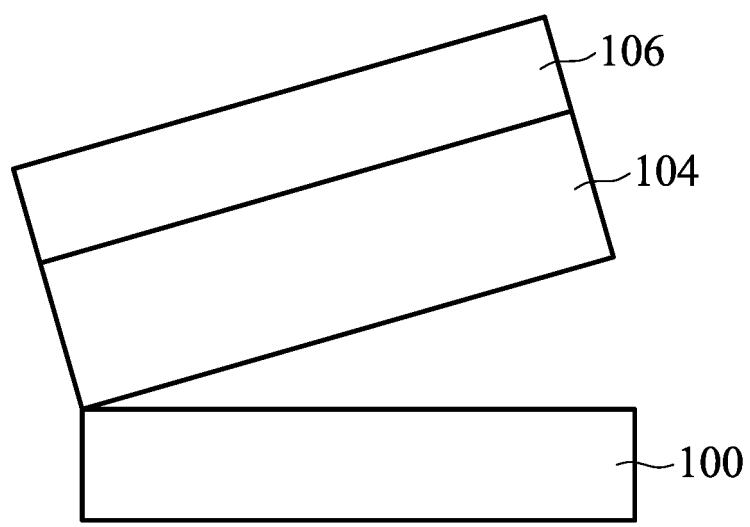
FIG. 2 is a cross-sectional view of showing the subsequent fabrication of a semiconductor device structure shown in FIG. 1D in accordance with some embodiments.

In some embodiments, after the semiconductor process 110 is performed, the bonding layer 102 is removed to separate the first transparent substrate 100 and the second transparent substrate 104 from each other. For example, the bonding layer 102 can be irradiated with light (e.g., UV light), so that the bonding layer 102 loses its adhesion, thus the device substrate 106 and the second transparent substrate 104 in the semiconductor device structure are debonded from the first transparent substrate 100, as shown in FIG. 2. In some embodiments, the second surface 100*b* of the separated first transparent substrate 100 may be cleaned and a bonding layer 102 is formed again (as shown in FIG. 1A). Next, the steps shown in FIGS. 1B to 1D and FIG. 2 are repeated. In addition, in some embodiments, other semiconductor processes or dicing processes are performed on the separated device substrate 106 to form individual semiconductor chips (not shown).

Figure 3A:
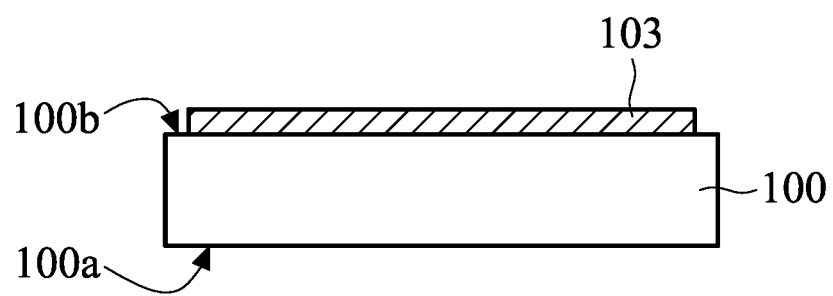
FIGS. 3A to 3D are cross-sectional views of semiconductor device structures at various stages of fabrication in accordance with some embodiments.

FIGS. 3A to 3D are cross-sectional views of semiconductor device structures at various stages of fabrication in accordance with some embodiments. Elements in FIGS. 3A to 3D that are the same as those in FIGS. 1A to 1D are labeled with the same reference numbers as in FIGS. 1A to 1D and are not described again for brevity. Referring to FIG. 3A, a first transparent substrate 100 is provided. The first transparent substrate 100 has a first surface 100*a* and a second surface 100*b*, which are opposite one another. For example, the first transparent substrate 100 may be a glass wafer, which facilitates the WLP process and serves as a temporary carrier substrate in the manufacture of the semiconductor device structure.

Afterwards, a conductive layer 103 is formed on the first transparent substrate 100 to cover the second surface 100*b* of the first transparent substrate 100. In some embodiments, the area of the conductive layer 103 may be substantially equal to or less than the area of the second surface 100*b* of the first transparent substrate 100. The conductive layer 103 can be used for the subsequent electrostatic chuck to generate a chucking force. In some embodiments, the conductive layer 103 includes a metal layer, such as aluminum, copper, alloys thereof, or other suitable metal materials. Moreover, the metal layer needs to have an appropriate thickness to facilitate the penetration of light and have sufficient electrical conductivity.

In some embodiments, the conductive layer 103 includes copper-aluminum alloy, and the thickness thereof is in a range from about 5 nm to 20 nm. In some other embodiments, the thickness of the conductive layer 103 is in a range from about nm to 10 nm. As a result, the conductive layer 103 has a suitable light transmittance, so as to facilitate the subsequent illumination for the bonding layer. In addition, the conductive layer 103 also has a suitable conductivity for the subsequent electrostatic chuck to generate a chucking force. In some other embodiments, the conductive layer 103 is a conductive layer with light transparency, such as indium tin oxide (ITO), indium zinc oxide (IZO), or the like.

Figure 3B:
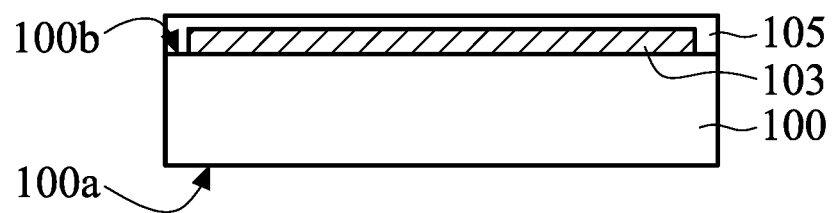

Referring to FIG. 3B, an insulating protective layer 105 is formed to cover the conductive layer 103 and the first transparent substrate 100. For example, the formed insulating protective layer 105 covers the upper surface and sidewalls of the conductive layer 103. In addition, in the case where the area of the conductive layer 103 is less than the area of the second surface 100*b* of the first transparent substrate 100, the insulating protective layer 105 further covers the second surface 100*b* of the first transparent substrate 100, as shown in FIG. 3B. During the subsequent debonding of the bonding layer 102 and surface cleaning of the first transparent substrate 100, the insulating protective layer 105 protects the underlying conductive layer 103 to prevent the conductive layer 103 from being damaged and losing its functionality. In some embodiments, the insulating protective layer 105 is made of inorganic materials (such as silicon oxide, silicon nitride, silicon oxynitride, metal oxide or a combination thereof), organic polymer materials (such as polyimide, butylcyclobutene (BCB), parylene, polynaphthalenes, fluorocarbons or acrylates), or another suitable insulating material. For example, the insulating protective layer 105 is made of silicon oxide.

Figure 3C:
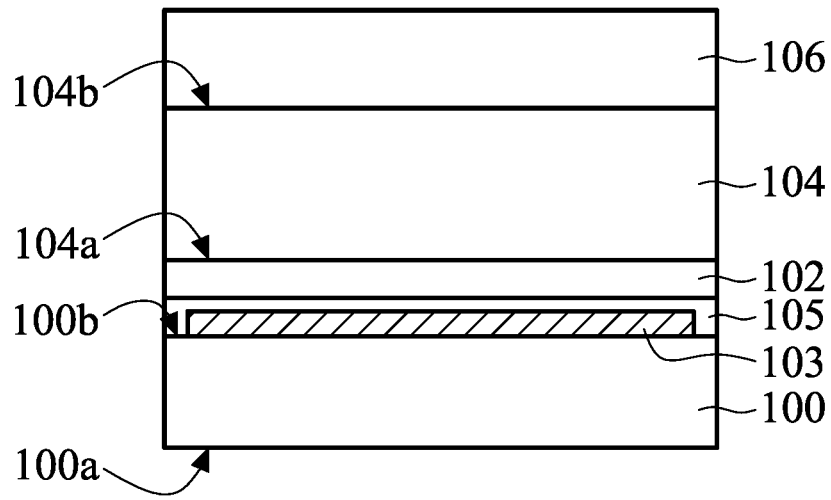

Afterwards, referring to FIG. 3C, a bonding layer 102 is formed on the second surface 100*b* of the first transparent substrate 100. Next, a second transparent substrate 104 and a device substrate 106 are provided. In some embodiments, the second transparent substrate 104 has a first surface 104*a* and a second surface 104*b*, which are opposite one another. In some embodiments, the second transparent substrate 104 is a glass wafer, which facilitates the WLP process, and serves as a carrier substrate or a cover plate for the device substrate 106 in the manufacture of the semiconductor device structure. In some embodiments, the second transparent substrate 104 is thicker than the first transparent substrate 100.

Next, the insulating protective layer 105 is bonded to the first surface 104*a* of the second transparent substrate 104 via the bonding layer 102.

Figure 3D:
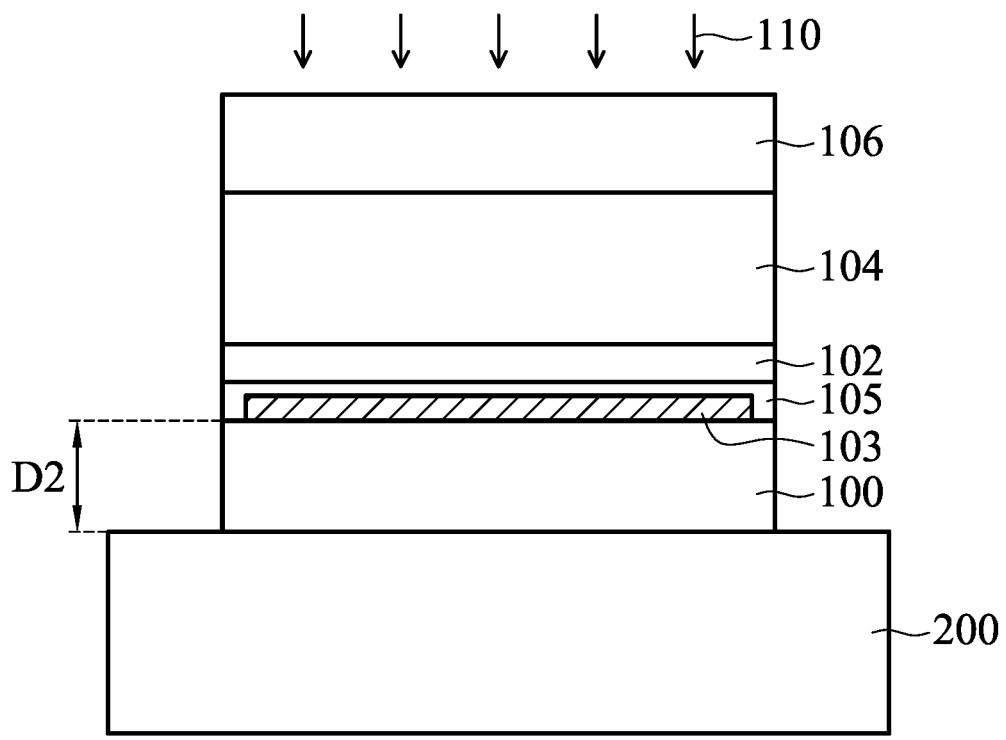

Referring to FIG. 3D, after bonding the insulating protective layer 105 to the second transparent substrate 104, the structure shown in FIG. 3C (i.e., the transparent substrate 100 on which the first device substrate 106 and the second transparent substrate 104 are formed) is placed on an electrostatic chuck 200 in a process chamber (not shown), so as to facilitate a subsequent semiconductor process 110. Before performing the semiconductor process 110, voltage can be applied to the electrostatic chuck 200 to generate a chucking force between the conductive layer 103 and the electrostatic chuck 200, thereby affixing the structure shown in FIG. 3C to the electrostatic chuck 200, in which the first surface 100*a* of the transparent substrate 100 faces the upper surface of the electrostatic chuck 200, as shown in FIG. 3D.

Unlike the embodiments shown in FIG. 1D which use the chucking force between the device substrate 106 and the electrostatic chuck 200 to fix the semiconductor device structure, embodiments shown in FIG. 3D use the chucking force between the conductive layer 103 and the electrostatic chuck 200 to fix the semiconductor device structure. By selecting the conductive layer 103 with higher conductivity than the device substrate 106, the chucking force between the conductive layer 103 and the electrostatic chuck 200 is greater than the chucking force between the device substrate 106 and the electrostatic chuck 200.

Moreover, the distance D2 (as shown in FIG. 3D) between the conductive layer 103 and the electrostatic chuck 200 is shorter than the distance D1 (as shown in FIG. 1D) between the device substrate 106 and the electrostatic chuck 200. Therefore, the chucking force generated between the conductive layer 103 and the electrostatic chuck 200 can be further enhanced. As a result, a sufficient chucking force can be generated between the conductive layer 103 and the electrostatic chuck 200 to cope with the outgassing problem of the semiconductor device structure on the electrostatic chuck 200 during the semiconductor processes. In other words, before the voltage is applied to the electrostatic chuck 200, the additional steps of pre-baking and vacuum pumping do not need to be performed on the semiconductor device structure. In addition, due to the improvement of the chucking force, the voltage applied to the electrostatic chuck 200 can be reduced, thereby prolonging the life span of the electrostatic chuck 200.

After the semiconductor device structure is affixed to the electrostatic chuck 200, the semiconductor process 110 is performed on the device substrate 106. For example, the process chamber is an etching process chamber, and the semiconductor process 110 is an etching process for forming the insulating layer, conductive pads and/or interconnection structures.

Figure 4:
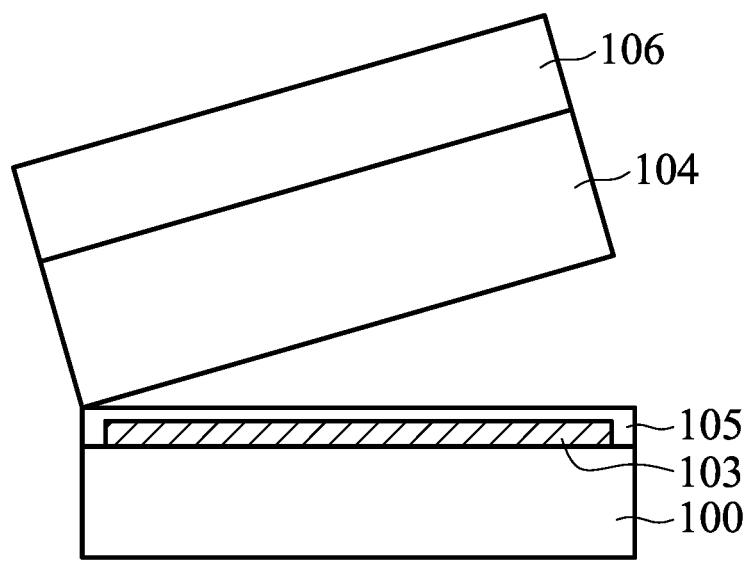
FIG. 4 is a cross-sectional view of showing the subsequent fabrication of a semiconductor device structure shown in FIG. 1D in accordance with some embodiments.

In some embodiments, after performing the semiconductor process 110, the bonding layer 102 is removed to separate the first transparent substrate 100 from the second transparent substrate 104 having the device substrate 106, as shown in FIG. 4. In some embodiments, the first transparent substrate 100 is reusable. For example, the upper surface of the insulating protective layer 105 formed on the separated first transparent substrate 100 can be cleaned and a bonding layer 102 can be formed on the insulating protective layer 105 again. Next, steps shown in FIG. 3D and FIG. 4 are repeated. In addition, in some embodiments, other semiconductor processes or dicing processes are performed on the separated device substrate 106 to form individual semiconductor chips (not shown).

According to the aforementioned embodiments, since there is an additional conductive layer formed on the temporary carrier substrate (i.e., the first transparent substrate), the operating distance of the chucking force generated by the electrostatic chuck can be shortened, thereby improving the chucking force for fixing the semiconductor device structure on the electrostatic chuck. Moreover, since the conductive layer (e.g., metal) has high conductivity, it helps to enhance the chucking force generated by the electrostatic chuck. As a result, the additional steps of pre-baking and vacuum pumping for the semiconductor device structure can be skipped, so as to shorten the process time and reduce the manufacturing cost. Moreover, the voltage applied to the electrostatic chuck can be reduced, thereby prolonging the life span of the electrostatic chuck.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor device structure, comprising:
a first transparent substrate having a first surface and a second surface, which are opposite one another;
a conductive layer disposed on the second surface of the first transparent substrate;
an insulating protective layer covering the conductive layer and the first transparent substrate;
a second transparent substrate disposed over the first transparent substrate and having a first surface facing the first transparent substrate and a second surface, which are opposite one another;
a device substrate disposed on the second surface of the second transparent substrate; and
a bonding layer bonding the insulating protective layer to the first surface of the second transparent substrate.

2. The semiconductor device structure as claimed in claim 1, wherein the conductive layer comprises a metal layer.

3. The semiconductor device structure as claimed in claim 2, wherein the metal layer has a thickness in a range from 5 nm to 20 nm.

4. The semiconductor device structure as claimed in claim 1, wherein the conductive layer has a conductivity higher than a conductivity of the device substrate.

5. The semiconductor device structure as claimed in claim 4, wherein the conductive layer is a conductive layer with light transparency.

6. The semiconductor device structure as claimed in claim 1, wherein the conductive layer has an area less than an area of the first transparent substrate, and wherein the insulating protective layer covers an upper surface and sidewalls of the conductive layer.

7. The semiconductor device structure as claimed in claim 1, wherein the bonding layer comprises a light-to-heat conversion, ultraviolet curing or thermal curing temporary bonding material.

8. The semiconductor device structure as claimed in claim 1, wherein the device substrate comprises a semiconductor wafer.

9. The semiconductor device structure as claimed in claim 8, wherein the first transparent substrate and the second transparent substrate each comprise a glass wafer.

10. The semiconductor device structure as claimed in claim 1, wherein the first transparent substrate has a thickness less than a thickness of the second transparent substrate.

11. A method for forming a semiconductor device structure, comprising:
providing a first transparent substrate having a first surface and a second surface, which are opposite one another;
forming a conductive layer on the second surface of the first transparent substrate;
forming an insulating protective layer to cover the conductive layer and the first transparent substrate;
providing a second transparent substrate and a device substrate, wherein the second transparent substrate has a first surface and a second surface, which are opposite one another, and the device substrate is disposed on the second surface of the second transparent substrate; and
bonding the insulating protective layer to the first surface of the second transparent substrate via a bonding layer.

12. The method as claimed in claim 11, further comprising:
chucking the first surface of the first transparent substrate that has the device substrate and the second transparent substrate formed thereon to an electrostatic chuck after bonding the insulating protective layer to the second transparent substrate; and
performing a semiconductor process on the device substrate on the electrostatic chuck.

13. The method as claimed in claim 12, further comprising separating the first transparent substrate and the second transparent substrate with the device substrate from the bonding layer.

14. The method as claimed in claim 12, wherein a distance between the conductive layer and the electrostatic chuck is shorter than a distance between the device substrate and the electrostatic chuck.

15. The method as claimed in claim 11, wherein the conductive layer comprises a metal layer.

16. The method as claimed in claim 11, wherein the conductive layer is a conductive layer with light transparency.

17. The method as claimed in claim 11, wherein the conductive layer has a conductivity higher than a conductivity of the device substrate.

18. The method as claimed in claim 17, wherein the device substrate comprises a semiconductor wafer, and the first transparent substrate and the second transparent substrate each comprise a glass wafer.

19. The method as claimed in claim 17, wherein the first transparent substrate has a thickness less than a thickness of the second transparent substrate.

20. The method as claimed in claim 11, wherein the bonding layer comprises a light-to-heat conversion, ultraviolet curing or thermal curing temporary bonding material.

* * * * *